United States Patent
Kaga et al.

(10) Patent No.: US 7,915,533 B2
(45) Date of Patent: Mar. 29, 2011

(54) SILICON NITRIDE SUBSTRATE, A MANUFACTURING METHOD OF THE SILICON NITRIDE SUBSTRATE, A SILICON NITRIDE WIRING BOARD USING THE SILICON NITRIDE SUBSTRATE, AND SEMICONDUCTOR MODULE

(75) Inventors: Youichirou Kaga, Saitama (JP); Hiromi Kikuchi, Saitama (JP); Hisayuki Imamura, Saitama (JP); Junichi Watanabe, Saitama (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 11/911,794

(22) PCT Filed: Apr. 14, 2006

(86) PCT No.: PCT/JP2006/307936
§ 371 (c)(1),
(2), (4) Date: Oct. 17, 2007

(87) PCT Pub. No.: WO2006/118003
PCT Pub. Date: Nov. 9, 2006

(65) Prior Publication Data
US 2009/0039477 A1    Feb. 12, 2009

(30) Foreign Application Priority Data
Apr. 28, 2005   (JP) .................................. 2005-133292

(51) Int. Cl.
*H01L 29/00*   (2006.01)
*H01B 3/12*    (2006.01)
*H05K 7/06*    (2006.01)

(52) U.S. Cl. ..................... 174/137 B; 264/647; 361/688
(58) Field of Classification Search ................. 257/655, 257/720, E29.109; 174/137 B; 264/647
See application file for complete search history.

(56) References Cited

U.S. PATENT DOCUMENTS

| | | | | |
|---|---|---|---|---|
| 4,609,633 A | * | 9/1986 | Fukuhara et al. ............ | 501/97.2 |
| 5,200,374 A | * | 4/1993 | Yamada et al. .............. | 501/98.2 |
| 5,804,523 A | * | 9/1998 | Oda et al. ..................... | 501/97.2 |

(Continued)

FOREIGN PATENT DOCUMENTS

DE           10146227           8/2002

(Continued)

OTHER PUBLICATIONS

F.K.Lotgering, Topotactical reactions with ferrimagnetic oxides having hexagonal crystal structures, Feb. 1959, Journal of Inorganic and Nuclear Chemistry, vol. 9, Issue 2, pp. 113-123.*

*Primary Examiner* — Evan Pert
*Assistant Examiner* — Jordan Klein
(74) *Attorney, Agent, or Firm* — Paul F. Neils, Esq.; Akerman Senterfitt LLP (57) ABSTRACT

In the silicon nitride substrate concerning an embodiment of the invention, degree of in-plane orientation fa of β type silicon nitride is 0.4-0.8. Here, degree of in-plane orientation fa can be determined by the rate of the diffracted X-ray intensity in each lattice plane orientation in β type silicon nitride. As a result of research by the inventors, it turned out that both high fracture toughness and high thermal conductivity are acquired, when degree of in-plane orientation fa was 0.4-0.8. Along the thickness direction, both the fracture toughness of 6.0 MPa·m$^{1/2}$ or higher and the thermal conductivity of 90 W/m·K or higher can be attained.

4 Claims, 6 Drawing Sheets

U.S. PATENT DOCUMENTS

| | | | | |
|---|---|---|---|---|
| 5,908,798 A | * | 6/1999 | Chen et al. | 501/98.2 |
| 6,139,791 A | * | 10/2000 | Chen et al. | 264/642 |
| 6,617,272 B2 | * | 9/2003 | Itoh et al. | 501/97.2 |
| 7,031,166 B2 | * | 4/2006 | Imamura et al. | 361/750 |
| 2002/0164475 A1 | * | 11/2002 | Imamura et al. | 428/325 |

FOREIGN PATENT DOCUMENTS

| | | | |
|---|---|---|---|
| JP | 62-207769 A | | 9/1987 |
| JP | 9-165265 A | | 6/1997 |
| JP | 9-268069 A | | 10/1997 |
| JP | 09268069 A | * | 10/1997 |
| JP | 2001-019555 A | | 1/2001 |
| JP | 2001-335359 A | | 12/2001 |
| JP | 2001335359 A | * | 12/2001 |
| JP | 2002-029849 A | | 1/2002 |
| JP | 2003-313079 A | | 11/2003 |
| JP | 2003313079 A | * | 11/2003 |
| JP | 2005-255462 A | | 9/2005 |

* cited by examiner

FIG.1

| | Manufacturing Condition | | | Composition of Sintering Aids (mol %) (in Raw Material) | | | | Composition of Sintering Aids (mol %) (in Ceramics) | | | |
|---|---|---|---|---|---|---|---|---|---|---|---|
| | Sintering Condition | | Composition of β-type Silicon Nitride (mass %) | $Lu_2O_3$ | $Gd_2O_3$ | $Y_2O_3$ | MgO | $Lu_2O_3$ | $Gd_2O_3$ | $Y_2O_3$ | MgO |
| | Temperature | Time | | | | | | | | | |
| Comparative Example.1 | 1975 | 30 | 30 | 2.2 | 2.3 | 0 | 7 | 1.4 | 1.2 | 0 | 0.05 |
| Comparative Example.2 | 1975 | 10 | 30 | 1.6 | 1.6 | 0 | 13 | 1.5 | 1.4 | 0 | 10 |
| Example.1 | 1950 | 50 | 10 | 1.1 | 1.2 | 0 | 7 | 0.32 | 0.22 | 0 | 0.12 |
| Example.2 | 1950 | 30 | 10 | 1.1 | 1.2 | 0 | 7 | 0.41 | 0.43 | 0 | 0.14 |
| Example.3 | 1950 | 5 | 5 | 1.1 | 0 | 1.2 | 7 | 1 | 0 | 0.9 | 5.1 |
| Comparative Example.3 | 1950 | 5 | 5 | 1.1 | 0 | 1.2 | 10 | 1.1 | 0 | 1.1 | 8.6 |
| Comparative Example.4 | 1950 | 5 | 0 | 0 | 2.3 | 0 | 7 | 0 | 2 | 0 | 5.2 |
| Comparative Example.5 | 1950 | 5 | 0 | 0.2 | 0.2 | 0 | 0.9 | 0.1 | 0.1 | 0 | 0.02 |
| Comparative Example.6 | 1950 | 5 | 0 | 0 | 0 | 1.9 | 22 | 0 | 0 | 1.5 | 18 |
| Comparative Example.7 | 1850 | 5 | 0 | 0 | 0 | 1.9 | 22 | 0 | 0 | 1.8 | 20 |
| Example.4 | 1900 | 5 | 40 | 1.5 | 1.5 | 0 | 10 | 1.3 | 0 | 1.3 | 7.5 |
| Example.5 | 1900 | 30 | 5 | 1.1 | 0 | 1.4 | 7 | 0.9 | 0 | 0.9 | 7 |
| Example.6 | 1950 | 30 | 10 | 0.4 | 0.4 | 0 | 1.7 | 0.15 | 0.13 | 0 | 0.03 |
| Comparative Example.8 | 1975 | 30 | 30 | 1.1 | 1.2 | 0 | 22 | 0.15 | 1.4 | 0 | 10 |
| Comparative Example.9 | 1900 | 5 | 1 | 0 | 2 | 0 | 7 | 0 | 0.8 | 0 | 5.2 |
| Comparative Example.10 | 1900 | 5 | 1 | 1.2 | 0 | 0 | 7 | 1 | 0 | 0 | 5.5 |
| Comparative Example.11 | 1975 | 30 | 10 | 1.1 | 1.2 | 0 | 7 | 0.41 | 0.43 | 0 | 0.02 |
| Example.7 | 1950 | 50 | 30 | 0 | 3.5 | 0 | 7 | 0 | 1.2 | 0 | 0.14 |
| Example.8 | 1950 | 50 | 30 | 0 | 0 | 3.8 | 7 | 0 | 0 | 1 | 0.13 |
| Example.9 | 1975 | 30 | 0 | 2.2 | 2.3 | 0 | 7 | 1 | 0.9 | 0 | 0.05 |
| Example.10 | 1950 | 50 | 0 | 2.2 | 0 | 2.4 | 7 | 1.2 | 0 | 0.9 | 0.12 |

| | Degree of in-plane orientation | Fracture Toughness $K_{IC}$ (MPa·m$^{1/2}$) | | Thermal Conductivity along the thickness direction | Reliability | Thermal Resistance (°C/W) |
|---|---|---|---|---|---|---|
| | | along the in-plane direction | along the thickness direction | | | |
| Comparative Example.1 | 0.90 | 2.7 | 9.0 | 43 | × | 0.30 |
| Comparative Example.2 | 0.88 | 3.2 | 9.0 | 52 | ○ | 0.30 |
| Example.1 | 0.75 | 3.3 | 8.3 | 90 | ○ | 0.20 |
| Example.2 | 0.62 | 4.2 | 7.2 | 120 | ○ | 0.15 |
| Example.3 | 0.44 | 4.3 | 6.5 | 125 | ○ | 0.20 |
| Comparative Example.3 | 0.38 | 4.5 | 5.5 | 130 | × | 0.20 |
| Comparative Example.4 | 0.35 | 4.2 | 5.4 | 110 | × | 0.20 |
| Comparative Example.5 | 0.15 | 4.8 | 4.7 | 115 | × | 0.20 |
| Comparative Example.6 | 0.32 | 4.0 | 5.5 | 110 | × | 0.20 |
| Comparative Example.7 | 0.11 | 4.7 | 5.6 | 95 | × | 0.20 |
| Example.4 | 0.42 | 4.3 | 6.5 | 100 | ○ | 0.20 |
| Example.5 | 0.48 | 4.5 | 6.7 | 105 | ○ | 0.20 |
| Example.6 | 0.51 | 4.3 | 6.4 | 110 | ○ | 0.20 |
| Comparative Example.8 | 0.85 | 3.0 | 8.2 | 60 | ○ | 0.25 |
| Comparative Example.9 | 0.13 | 3.8 | 4.3 | 90 | × | 0.20 |
| Comparative Example.10 | 0.15 | 4.0 | 4.5 | 90 | × | 0.20 |
| Comparative Example.11 | 0.31 | 4.1 | 5.4 | 95 | × | 0.20 |
| Example.7 | 0.45 | 4.2 | 6.5 | 95 | ○ | 0.20 |
| Example.8 | 0.44 | 4.3 | 6.4 | 95 | ○ | 0.20 |
| Example.9 | 0.42 | 4.1 | 6.2 | 90 | ○ | 0.25 |
| Example.10 | 0.41 | 4.2 | 6.1 | 90 | ○ | 0.25 |

FIG.6

1 : Silicon nitride substrate

FIG.7

2 : Silicon nitride substrate

SILICON NITRIDE SUBSTRATE, A MANUFACTURING METHOD OF THE SILICON NITRIDE SUBSTRATE, A SILICON NITRIDE WIRING BOARD USING THE SILICON NITRIDE SUBSTRATE, AND SEMICONDUCTOR MODULE

CLAIM FOR PRIORITY

This application is a U.S. National Stage Application of PCT/JP2006/307936 filed on Apr. 14, 2006, claiming priority to Japanese application JP 2005-133292 filed on Apr. 28, 2005, the contents of both of which are incorporated herein by reference.

BACKGROUND OF THE INVENTION

1. Field of the Invention

This invention relates to a silicon nitride ($Si_3N_4$) substrate with high mechanical strength, high insulation resistance, and high thermal conductivity, and a manufacturing method for the same. This invention also relates to a silicon nitride wiring board and semiconductor module using the above-mentioned silicon nitride substrate.

2. Description of the Related Art

In recent years, power semiconductor modules (IGBT, MOSFET, etc.) in which high current or high voltage operation is possible, are used as an inverter for electric motors. As a substrate used for the power semiconductor module, insulating ceramics substrates made of aluminum nitride or silicon nitride are used. The conductive metal plate in this substrate which serves as a circuit on one face (upper surface) is formed, and the metal plate for heat dissipation is formed on another face (undersurface).

The ceramic wiring boards with this structure are used widely. The copper plate or the aluminum plate is used as these metal plates. Semiconductor devices etc. are mounted on the upper face of the conductive metal plate used as a circuit and the active brazing filler method is used for the connection between the ceramics substrate and the metal plates. What is called a direct bonding copper method, in which the copper plates are bonded directly, is also used.

However, in many cases, in the power semiconductor module using the ceramics substrate on which the metal circuit plate and the metal heat sink were bonded, thickness of the metal circuit plate and of the metal heat sink is made 0.3-0.5 mm, so that high current can be sent through them. When copper with high thermal conductivity is especially used for the metal circuit plate and the metal heat sink, thermal expansion coefficient of copper differs from ceramics greatly. Therefore, if copper is bonded to ceramics, heat stress will be generated in the cooling process after the connection of these metals and ceramics. This stress is generated as compression or tensile residual stress near the junction of the ceramic substrate. This residual stress makes a ceramic substrate cracked, or makes isolation voltage low. Or exfoliation of the metal circuit plate and the metal heat sink may be generated.

Although an aluminum nitride substrate has high thermal conductivity as a ceramic substrate, its mechanical strength is low, and the reliability in mechanical strength is low and the substrate is hard to be used. On the contrary, a silicon nitride substrate has high thermal conductivity, and has also excellent mechanical strength, high fracture toughness, and high heat-resistant fatigue characteristics. Therefore, various structures of silicon nitride substrates are proposed as shown below.

For example, in the conventional example, there is a silicon nitride substrate with 86-99 mol % of silicon nitride content, also containing other elements. Here, as the doped element, one or more elements selected among the group of yttrium (Y) and rare earth (RE) element of lanthanide are doped with 1-10 mol % of oxides of these elements. Moreover, one or more elements selected from lithium (Li), magnesium (Mg), calcium (Ca), titanium (Ti), zirconium (Zr), or hafnium (Hf) are doped with 0-4 mol % of oxide of these elements. Moreover, aluminum (Al) is also doped with 1000 ppm or less. The percentage of β type silicon nitride in this silicon nitride is 30% or more. This silicon nitride composite is manufactured by sintering at temperature of 1700-2000° C. in pressurized nitrogen atmosphere at pressure of 1 MPa or less (for example, refer to Japanese Patent No. 2002-29849). Hereafter, this technology is called the 1st conventional example.

Moreover, there are the following as other manufacturing method of a silicon nitride substrates. β type silicon nitride used as sintering aids and as seed crystals is added to the silicon nitride powder. The obtained mixed powder is distributed to carrier fluid, and slurry is prepared. After making forming body of β type silicon nitride by this slurry, the forming body is densified, after degreasing. Furthermore, after sintering at 1700-2000° C. at pressure of 1-100 atm nitrogen atmosphere, silicon nitride substrate is obtained. This silicon nitride substrate has the structure with some orientation and has thermal conductivity of 100-150 W/m·K along the orientation (for example, refer to Japanese Patent No. H09-165265). Hereafter, this technology is called the 2nd conventional example.

Moreover, there are the following as other silicon nitride substrates. In this silicon nitride substrate, the sum of the content of oxygen (O), aluminum (Al), calcium (Ca), and iron (Fe) is 1000 ppm or less. And the silicon nitride particles whose diameters along a short axis are 2 micrometers or more are contained. Some of such particles with diameter of 2 micrometers or more along the short axis, have orientation along the substrate plane direction or along the thickness direction (for example, refer to Japanese Patent No. 2001-19555). Hereafter, this technology is called the 3rd conventional example.

In the silicon nitride substrate composed of the silicon nitride substrate by the 1st above-mentioned conventional example, it is not taken into consideration about the orientation of β type silicon nitride at all. Therefore, there is a limit in raising thermal conductivity and fracture toughness. On the other hand, thermal conductivity and fracture toughness can be raised by carrying out orientation of the β type silicon nitride like the 2nd and 3rd above-mentioned conventional examples, because high thermal conductivity is acquired along the direction of the orientation since the number of grain boundaries spoiling the heat conduction is decreased. On the other hand, crack is hard to be grown along the perpendicular direction to the orientation, because the crack may have orientation by the orientation of β silicon nitride. Therefore, fracture toughness is improved.

Figure 7:
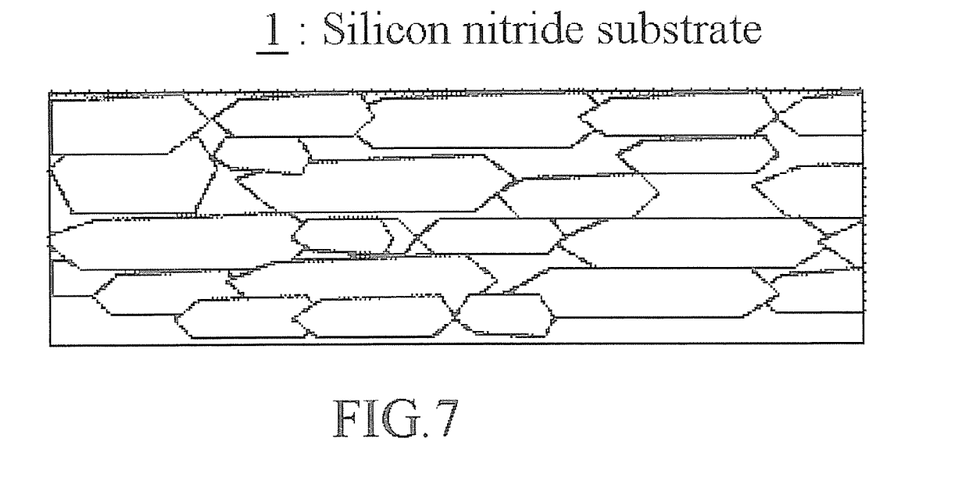
FIG. 7 shows an outline sectional view of the silicon nitride substrate with degree of in-plane orientation fa of around 1.
Figure 8:
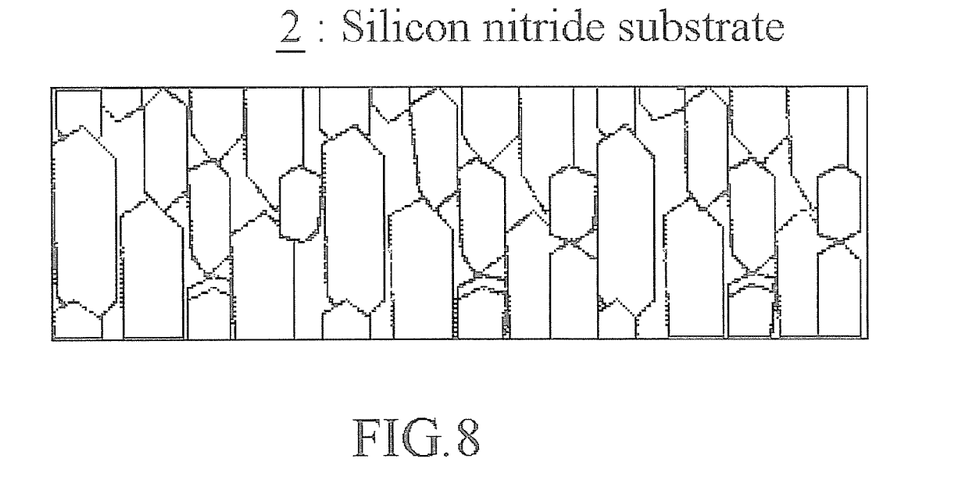
FIG. 8 shows an outline sectional view of the silicon nitride substrate with degree of in-plane orientation fa of around −1.
Figure 9:
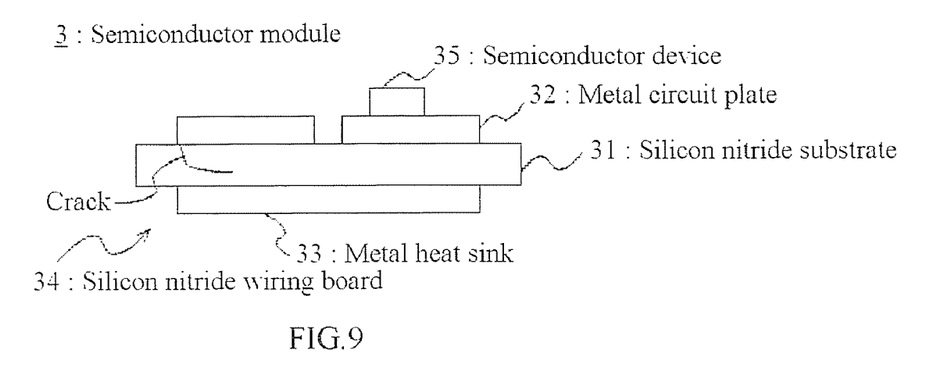
FIG. 9 shows a key map (side sectional view) for explaining situation in which a crack is generated in a silicon nitride substrate in a semiconductor module.

However, in the above-mentioned 2nd and 3rd conventional examples, while the thermal conductivity along the direction in the plane will become high, the thermal conductivity along the thickness direction becomes low, if the degree of orientation fa in the direction of the plane of the silicon nitride substrate 1 is too high as shown in FIG. 7. Here, below, the degree of orientation fa in the direction of the plane is called "degree of in-plane orientation." In the example of FIG. 7, fa is around 1. Therefore, in the semiconductor module composed of the silicon nitride wiring boards comprising this silicon nitride substrate, metal circuit plate, and metal heat sink, and semiconductor devices, thermal resistance cannot be made small. In addition, the meaning of the degree of in-plane orientation fa is mentioned later. On the other hand, in the 3rd above-mentioned conventional example, if the degree of orientation along the thickness direction of the silicon nitride substrate 2 is too high as shown in FIG. 8, the thermal conductivity along the thickness direction will become high. However, in-plane thermal conductivity becomes low. Here, in the example of FIG. 8, the degree of in-plane orientation fa is around −1. Moreover, when manufacturing the above-mentioned silicon nitride wiring board, the bonding temperature of the metal circuit plate made of copper (Cu) is about 800° C. In the cooling process from this temperature, or after the heat cycle while the semiconductor module is working, thermal stress is generated due to difference of the thermal expansion coefficient between copper and silicon nitride. Therefore, as shown in FIG. 9, the crack which goes into the silicon nitride substrate 31 from the perimeter part of the metal circuit plate 32 formed on the silicon nitride substrate 31 may be generated easily. Therefore, exfoliation of the metal circuit plate 32 may arise easily, and the reliability of the silicon nitride wiring board 34 is low. After all, in the conventional silicon nitride substrate, the problem concerning the degree of in-plane orientation fa, thermal conductivity, and fracture toughness was not examined. Moreover, what indicated a means to solve these problems is not found. In FIG. 9, the metal circuit plate 32 is bonded to the upper surface of the silicon nitride substrate 31, the metal heat sink 33 is bonded to the undersurface, respectively, and the silicon nitride wiring board 34 is constituted. Moreover, the semiconductor device 35 is mounted on the upper face of the metal circuit plate 32, and the semiconductor module 3 is constituted.

The present invention is made in view of the situation mentioned above, and an object of the invention is to provide a silicon nitride wiring board and a semiconductor module using the silicon nitride substrate which can solve the above subjects and a manufacturing method thereof.

SUMMARY OF THE INVENTION

An object of this invention is to solve the above subjects. This invention is constructed as described below in order to solve the aforementioned problems.

An aspect in accordance with the present invention provides a silicon nitride substrate containing β type silicon nitride particles and doped elements comprising at least one element selected from rare earth (RE) elements, wherein degree of in-plane orientation fa, which is a ratio of orientation along in-plane direction perpendicular to thickness direction of the silicon nitride substrate, is 0.4-0.8, wherein the fa is calculated from diffracted X-ray intensities by each lattice plane of the β type silicon nitride particles and of the silicon nitride substrate.

Moreover, in the silicon nitride substrate of the present invention, the degree of in-plane orientation fa is expressed as formula (1), $$fa = (P - P_0)/(1 - P_0) \quad (1)$$

here, P is expressed as formula (2), and P means a ratio of sum of diffracted X-ray intensities by (110), (200), (210), (310), and (320) planes of β type silicon nitride in the silicon nitride substrate, and $P_0$ is expressed as formula (3), and $P_0$ means a ratio of sum of diffracted X-ray intensities by (100), (200), (210), (310), and (320) planes of β type silicon nitride in the silicon nitride particles, $$P = (I_{(110)} + I_{(200)} + I_{(210)} + I_{(310)} + I_{(320)})/ \quad (2)$$
$$(I_{(110)} + I_{(200)} + I_{(101)} + I_{(210)} + I_{(201)} + I_{(310)} + I_{(320)} + I_{(002)})$$

$$P_0 = (I'_{(110)} + I'_{(200)} + I'_{(210)} + I'_{(310)} + I'_{(320)})/ \quad (3)$$
$$(I'_{(110)} + I'_{(200)} + I'_{(101)} + I'_{(210)} + I'_{(201)} + I'_{(310)} + I'_{(320)} + I'_{(002)})$$

Moreover, in the silicon nitride substrate of the present invention, wherein fracture toughness along thickness direction of the silicon nitride substrate is higher than fracture toughness along in-plane direction of the silicon nitride substrate, wherein the fracture toughness along the thickness direction is 6.0 MPa·m$^{1/2}$ or higher, wherein the fracture toughness along the in-plane direction is higher than 3.0 MPa·m$^{1/2}$, wherein thermal conductivity along the thickness direction is higher than 90 W/m·K.

Moreover, in the silicon nitride substrate of the present invention, the doped elements are lutetium (Lu) and one element selected from the RE elements excluding Lu and including yttrium (Y), wherein Lu is doped with 0.14-1.30 mol % of $Lu_2O_3$, wherein the one element is doped with 0.12-1.30 mol % of oxide of the one element, wherein magnesium (Mg) is also doped with 0.03-8.0 mol % of MgO.

Moreover, in the silicon nitride substrate of the present invention, the one element is gadolinium (Gd), and is doped with 0.12-1.30 mol % of $Gd_2O_3$.

Another aspect in accordance with the present invention provides a manufacturing method of a silicon nitride substrate comprising the steps of: mixing 99-50 mass % of α type silicon nitride powder with oxygen concentration of 2.0 mass % or less, and 1-50 mass % of β type silicon nitride powder with β fraction of 30-100% and with oxygen concentration of 0.5 mass % or less and with mean particle diameter of 0.2-10 micrometers and with mean aspect ratio of 10 or less, as silicon nitride raw material powder; mixing 0.35-1.60 mol % of $Lu_2O_3$ powder, 1.70-10 mol % of MgO, and 0.39-1.5 mol % of oxide of doped elements comprising at least one element selected from rare earth elements excluding Lu and including Y, with the silicon nitride raw material powder; making forming body from the mixed powder; and sintering the forming body at temperature of 1700-2000° C. in pressurized nitrogen atmosphere at pressure of 0.5-1.0 MPa for 5-50 hours.

Another aspect in accordance with the present invention provides a silicon nitride wiring board comprising silicon nitride substrate as described above, metal circuit plate bonded on one face of the silicon nitride substrate, and metal heat sink bonded on the other face of the silicon nitride substrate.

Another aspect in accordance with the present invention provides a semiconductor module comprising silicon nitride wiring board as described above, and semiconductor device mounted on the silicon nitride wiring board.

According to the present invention, a silicon nitride substrate with high thermal conductivity and high fracture toughness along the thickness direction, can be obtained. Therefore, a silicon nitride wiring board with both low thermal resistance and high reliability is obtained. Therefore, thermal resistance of the semiconductor module can be made low and reliability of that can be made high.

DETAILED DESCRIPTION OF THE INVENTION

In the silicon nitride substrate concerning an embodiment of the invention, degree of in-plane orientation fa of β type silicon nitride is 0.4-0.8. Here, degree of in-plane orientation fa can be determined by the rate of the diffracted X-ray intensity in each lattice plane orientation in β type silicon nitride. This is a rate of the orientation within a plane perpendicular to the thickness direction of the silicon nitride substrate.

Here, degree of in-plane orientation fa is expressed as formula (1), which was given by F. K. Lotgerling (F. K. Lotgerling: J. Inorg. Nucl. Chem., 9 (1959), P113), based on the intensity of diffracted X-ray by the upper plane of the silicon nitride substrate here.

$$fa = (P - P_0)/(1 - P_0) \quad (1)$$

Figure 1:
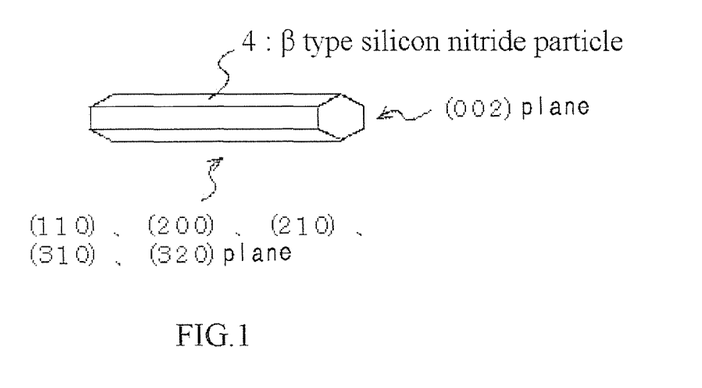
FIG. 1 shows a key map for explaining the lattice plane of β type silicon nitride particle.

P in formula (1) is expressed as formula (2). P means a ratio of sum of each of the diffracted X-ray intensity of (110), (200), (210), (310), and (320) planes of β type silicon nitride particle 4 shown in FIG. 1. $P_0$ is expressed as formula (3).

$$P = (I_{(110)} + I_{(200)} + I_{(210)} + I_{(310)} + I_{(320)})/ \quad (2)$$
$$(I_{(110)} + I_{(200)} + I_{(101)} + I_{(210)} + I_{(201)} + I_{(310)} + I_{(320)} + I_{(002)})$$

$$P_0 = (I'_{(110)} + I'_{(200)} + I'_{(210)} + I'_{(310)} + I'_{(320)})/ \quad (3)$$
$$(I'_{(110)} + I'_{(200)} + I'_{(101)} + I'_{(210)} + I'_{(201)} + I'_{(310)} + I'_{(320)} + I'_{(002)})$$

The silicon nitride substrate is mainly composed of large pillar-shaped particles of β type silicon nitride, and fine particles. Here, degree of in-plane orientation fa is determined by orientation of the large pillar-shaped particles. When degree of in-plane orientation fa is 0, the large pillar-shaped particles are arranged randomly. Like the silicon nitride substrate (degree of in-plane orientation fa is 0.4-0.8) concerning an embodiment of the invention, when degree of in-plane orientation fa is larger than zero, it is shown that the large pillar-shaped particles with inclination angle of larger than 45 degrees of long axis from the thickness direction of the silicon nitride substrate are contained more. It is shown that inclination angle of the long axis of the pillar-shaped particles from the thickness direction of the silicon nitride substrate is close to 90 degrees, so that the value of the degree of in-plane orientation fa is around 1.

When the degree of in-plane orientation fa is 1, as described above, the crack which goes into the silicon nitride substrate from the perimeter part of the metal circuit plate bonded to the silicon nitride substrate does not progress easily (the fracture toughness along the thickness direction of the silicon nitride substrate is high), and the heat generated from the semiconductor device is hard to be transmitted from the metal circuit plate to the metal heat sink through the silicon nitride substrate easily (the heat conductivity along the thickness direction of the silicon nitride substrate is low). On the other hand, when the degree of in-plane orientation fa is −1, as described above, the heat generated from the semiconductor device is transmitted from the metal circuit plate to the metal heat sink through the silicon nitride substrate easily (the heat conductivity along the thickness direction of the silicon nitride substrate is high), and the crack which goes into the silicon nitride substrate from the perimeter part of the metal circuit plate bonded to the silicon nitride substrate progresses easily (the fracture toughness along the thickness direction of a silicon nitride substrate is low). So, as a result of research by the inventors, it turned out that both high fracture toughness and high thermal conductivity are acquired, when degree of in-plane orientation fa was 0.4-0.8. In this case, the crack which goes into the silicon nitride substrate from the peripheral part of the metallic circuit plate bonded to the silicon nitride substrate do not progress easily, and heat is easily transmitted from the metallic circuit plate to the metal heat sink through the silicon nitride substrate. Because, the orientation of the crack especially along the thickness direction in the silicon nitride substrate by the pillar-shaped particles, takes place easily by setting degree of in-plane orientation fa to 0.4-0.8. Therefore, the fracture toughness along the thickness direction becomes higher than that along the in-plane direction. Since the number of the grain boundaries which spoil heat conduction is small enough along the thickness direction, the thermal conductivity along the thickness direction can be made high. Therefore, along the above-mentioned thickness direction, both the fracture toughness of 6.0 MPa·m$^{1/2}$ or higher and the thermal conductivity of 90 W/m·K or higher can be attained.

In order to obtain the silicon nitride wiring board with high heat dissipation, it is desirable to use a copper plate with high thermal conductivity for the metallic circuit plate and for the metal heat sink. However, in the cooling process from bonding temperature (about 800° C.), thermal stress is generated due to the thermal expansion coefficient difference between copper and silicon nitride, also in the heat cycle when working the semiconductor module. A crack progresses especially easily near the peripheral part of the metallic circuit plate in the silicon nitride substrate along the thickness direction. In order to inhibit the progress of this crack, it is necessary to set the fracture toughness to 6.0 MPa·m$^{1/2}$ or higher along the above-mentioned thickness direction. When the fracture toughness along the in-plane direction is extremely low, even if the progress of the crack can be suppressed, the crack progresses within the plane. Therefore, it is necessary to set the fracture toughness to 3.0 MPa·m$^{1/2}$ or more along the above-mentioned in-plane direction. In order to obtain a silicon nitride wiring board with more sufficient heat dissipation nature, it is preferred to use the silicon nitride substrate with thermal conductivity of 100 W/m·K or more along the thickness direction. It is also desirable to use copper plate with thickness of 0.5 mm or thicker for the metallic circuit plate and the metal heat sink. In order to make the thermal conductivity along the thickness direction 100 W/m·K or more, it is desirable to set the degree of in-plane orientation fa to 0.7 or less. Higher stress may be given to the silicon nitride substrate when copper plate with thickness of 0.5 mm or more is used for the metallic circuit plate and the metal heat sink. Therefore, it is desirable to set the fracture toughness to 6.5 MPa·m$^{1/2}$ or more along the thickness direction. For that purpose, it is desirable to set degree of in-plane orientation fa to be 0.5 or more. Therefore, the degree of in-plane orientation fa, is preferred to be 0.5-0.7 more desirably.

A silicon nitride substrate concerning an embodiment of the invention is mainly composed of β type silicon nitride. At least one element selected from magnesium (Mg), lutetium (Lu) and rare earth elements (RE) including yttrium (Y), are also doped as sintering aids. When Mg is contained as sintering aids, MgO, $Y_2O_3$, and $Yb_2O_3$ are used as raw material powder in many cases. The above mentioned action and effect concerning degree of in-plane orientation fa, the thermal conductivity, and fracture toughness, may not be influenced by the above mentioned sintering aids component. However, on the other hand, since it is necessary to set thermal conductivity and bending strength higher, and also for ease of manufacturing, the sintering aids components were also examined. Hereafter, it turns out that by using MgO for the sintering aids, degree of sintering is improved, and that by setting amount of MgO and $Lu_2O_3$ to a fixed range, and by setting the ratio of MgO to $Lu_2O_3$ to a fixed range, a silicon nitride substrate with high thermal conductivity, with high toughness and with high mechanical strength can be obtained. Because progress of the crack along the grain boundaries can be inhibited by generating the glass phase with specific composition in grain boundary phase. Here, Lu is doped with 0.14-1.30 mol % of $Lu_2O_3$ in the ceramics. When the doping content of Lu is less than 0.14 mol %, composition of the grain boundary phase may fluctuate, and thermal conductivity may decrease. On the other hand, when the doping content of Lu is 1.30 mol % or more, degree of sintering may be degraded and mechanical strength may be degraded. Doping content of Lu may be 0.15-1.00 mol % of $Lu_2O_3$ preferably, or may be 0.2-0.6 mol % more preferably.

Mg is preferred to be doped with 0.03-8.0 mol % of MgO in the silicon nitride substrate. When the doping content of Mg is less than 0.03 mol %, reaction as sintering aids cannot be given sufficiently, therefore, ceramics density becomes low. When the doping content of Mg is 8.0 mol % or more, too many glass phases are generated in grain boundaries, therefore, thermal conductivity becomes low. Doping content of Mg may be 0.04-5.00 mol % preferably, or may be 0.05-1.5 mol % more preferably. By doping MgO with rare earth oxide, liquid phase generation temperature is lowered and degree of sintering can be improved. And the amount of MgO in raw material is set to 1.70-10 mol % in this embodiment. An composition ratio of rare earth oxide to MgO, $(RE_xO_y)$/MgO may be set to less than 1, or 0.3-0.5 preferably. Thereby, at around 1700° C. which is sintering temperature, the glass phase composed of Mg—Si—O—N is formed, and sintering of silicon nitride is accelerated. After that, when keeping the temperature at 1800-2000° C., the silicon nitride is densified. Simultaneously, Mg in the grain boundary phase may be converted to MgO, and may evaporate from the silicon nitride substrate. At the same time, Si may be converted to $SiO_2$ and may evaporate. As the sintering may progress, composition of Mg, Si may decrease in the grain boundary phase, and the liquid phase with low melting point may decrease. On the other hand, since Lu exists, grain boundary phase with high melting point may be generated easily. Therefore, because the amount of MgO in the silicon nitride substrate after sintering may decrease, doping content of MgO may be 0.03-8.0 mol % preferably, and the ratio of MgO to rare earth oxide, $(RE_xO_y)$/MgO may be 0.3-9.5 preferably.

As sintering aids, it is useful to dope both Mg and Lu. Furthermore, some elements which may keep the thermal conductivity high, with low solubility to the silicon nitride particle, may be doped preferably. This element is selected from yttrium (Y) and the rare earth (RE) elements of lanthanoids. For example, at least one of rare earth elements, such as yttrium (Y), lantern (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), and ytterbium (Yb) are selected. Since the sintering can be done, without high temperature and without high pressure, Y, La, Ce, Nd, Sm, Gd, Dy, Er, and Yb are preferred. Since nano particles may be generated easily in the silicon nitride particle, and the nano particles may not dissolve easily, Gd is preferred especially. When Gd is used as the above-mentioned rare earth element, doping content of Gd in the silicon nitride substrate may be 0.12-1.30 mol % of $Gd_2O_3$ preferably. When the doping content of Gd is less than 0.12 mol %, the number of the nano particles may be small, therefore, thermal conductivity becomes low. When the doping content of Gd is 1.30 mol % or more, silicon nitride may become hard to be sintered, therefore, mechanical strength becomes low. The doping content of Gd may be 0.2-1.2 mol % of $Gd_2O_3$ preferably, or may be 0.2-1.0 mol % more preferably.

Next, the manufacturing method of the silicon nitride substrate concerning this embodiment is explained, α type silicon nitride raw material powder with oxygen amount of 2.0 mass % or less, is used. Because the amount of oxygen which dissolves in the silicon nitride particles generally becomes high, when the amount of oxygen in the raw material powder is high. Thereby, scattering of phonon which serves for heat-conduction may occur by the oxygen contained in the silicon nitride particle, and the thermal conductivity of the silicon nitride substrate may be decreased. Therefore, the amount of oxygen in raw material powder of α type silicon nitride may be few as much as possible preferably. The amount of oxygen may be 2.0 mass % or less preferably, or may be 1.5 mass % or less more preferably. In this embodiment, raw material powder of β type silicon nitride is mixed as seed crystal. The amount of oxygen which dissolve in silicon nitride particle greatly depends on the amount of oxygen in the raw material powder of β type silicon nitride, which is used as seed crystal. The amount of oxygen which dissolves in the silicon nitride particle becomes high, when this amount of oxygen is high. Therefore, in this embodiment, it is preferred to set the amount of oxygen in raw material powder of α type silicon nitride to 0.5 mass % or less. When each of the amount of Fe and the amount of Al in the raw material powder of silicon nitride exceed 100 ppm, respectively, Fe or Al may dissolve notably in the silicon nitride particle. Phonon may be scattered by this particle with dissolved oxygen, and the thermal conductivity of the silicon nitride substrate may be decreased remarkably. Therefore, it is preferred to set each of the amount of Fe and the amount of Al to 100 ppm or less in the raw material powder.

As sintering aids added to the raw material powder, 0.35-1.60 mol % of $Lu_2O_3$, 1.70-10 mol % of MgO, 0.39-1.5 mol % of oxide (except for $Lu_2O_3$) composed of at least of one element selected from the rare earth (RE) elements including Y, are weighed and added to the above-mentioned raw material powder of silicon nitride. After mixing an organic binder, a plasticizer, etc. with this raw material powder, it may be mixed uniformly by a ball mill etc. After defoaming and thickening the mixed raw material slurry, forming body is obtained from the slurry as sheet shaped with predetermined thickness by well-known doctor blade method. This sheet shaped forming body is sintered in a sintering furnace at temperature of 1700-2000 degree C., in pressurized nitrogen atmosphere at pressure of 0.5-1 MPa. When the sintering temperature is 1500° C. or lower, ceramics cannot be fully densified. When the sintering temperature is higher than 2000° C., grain growth progresses too much. Mechanical strength becomes insufficient in both cases. After all, for the sintering temperature, 1800-2000° C. is preferred, or 1850-1950° C. is preferred more. In order to suppress decomposition of silicon nitride, nitrogen atmosphere with high pressure may be preferred for the sintering. However, the pressure of 1 MPa or higher may not be preferred, because the cost for the facility of the sintering furnace is high. On the other hand, decomposition of silicon nitride occurs at 0.5 MPa or lower. Therefore, the pressurized nitrogen at 0.6-0.95 MPa is preferred.

When sintering time is shorter then 5 hours, ceramics cannot be fully densified. When sintering time exceeds 50 hours, a manufacturing cost becomes high. The ceramics obtained by the above mentioned manufacturing method are processed suitably, and become a substrate. Adjustment of the evaporation of oxygen in the sintering process may be done by the method of constituting the sintering furnace doubly, or by adjusting the size of the furnace, or by adjusting the airtightness of the furnace, for example. Since when the sintering time is longer, the amount of oxygen decreases, adjustment of the evaporation of oxygen can be done by adjusting sintering time. Also it can be done by adjusting the amount of packing powder, which is used to control the atmosphere of the sintering. Or, the combination of the above means can also be taken.

In the above-mentioned manufacturing method, the amount of used β type silicon nitride powder with β fraction of 30-100%, is preferred to be 1-50 mass %. When the amount of β type silicon nitride powder with β fraction of 30-100% is less than 1 mass %, effect of nucleus for crystal growth can be given, however, number of the nucleus is not sufficient because the amount is not enough. Therefore, unusual grain growth occurs, large particles are formed not uniformly all over the structure, and mechanical strength will decrease. When the amount of β type silicon nitride powder with β fraction of 30-100% is more than 50 mass %, because number of the nuclei may be too large, grown grains will collide with each other during the growth, and the growth may be inhibited. Therefore, although mechanical strength is obtained, the microstructure in the silicon nitride substrate composed of grown pillar-shaped particles, is not obtained, and it becomes difficult to obtain high thermal conductivity. When the mean particle diameter in the raw material powder of silicon nitride is less than 0.2 micrometer, the microstructure in which pillar-shaped particles are formed uniformly is not obtained, and it is difficult to obtain high thermal conductivity and high bending strength. When the mean particle diameter in the raw material powder of silicon nitride is larger than 10 micrometers, ceramics of silicon nitride cannot be densified. When an aspect ratio of the particle is more than 10, ceramics of silicon nitride cannot be densified. In an embodiment of the invention, the sintering condition including sintering temperature and sintering time, the amount of raw material powder of β type silicon nitride, and the amount of sintering aids, are adjusted suitably. By these, degree of in-plane orientation fa of the silicon nitride substrate concerning an embodiment of the invention can be arbitrarily set in the range of 0.4-0.8. It is more specifically explained by the example.

And the silicon nitride substrate manufactured by this method has high mechanical strength, high toughness, and high thermal conductivity. Based on these characteristics, this silicon nitride substrate may be used as various substrates, such as substrates for electrical circuits including high-frequency transistor and power IC, such as a substrate for multichip modules. etc, such as a heat exchanger substrate for Peltier devices, such as electrical parts with heat sinks for heating elements. When the silicon nitride substrate is used for a semiconductor module, cracks formed by heat cycles during the operation of the semiconductor device, may be inhibited. Therefore, the endurance against high temperature and the endurance against the heat cycles may be improve, and a substrate with excellent reliability is obtained. Even when the semiconductor device with high power and with large scale integration is mounted, there is little degradation of thermal resistance and the excellent thermal radiation characteristic may be given.

By bonding Cu circuit plate or Al circuit plate on one side or both side of this silicon nitride substrate by DBC (Direct Bonding Copper) method or active brazing filler method, a silicon nitride wiring board is fabricated. Here, in the DBC method, the silicon nitride substrate, and Cu circuit plate, or Al circuit plate are heated in inactive gas or nitrogen atmosphere at temperature higher than the eutectic point. These circuit boards are directly bonded to one face or both faces of the silicon nitride substrate via generated oxide layer composed of liquid phase of Cu—O, or Al—O eutectic compound. On the other hand, in active brazing filler method, solder of active brazing filler compound material, made of mixture or alloy of active metals such as titanium (Ti), zirconium (Zr), or hafnium (Hf), and metal with low melting point, such as silver (Ag) or Copper (Cu), may be used. Cu circuit plate or Al circuit plate may be bonded to one or both sides of the silicon nitride substrate in inactive gas atmosphere or in vacuum, after being heated and pressurized. After the circuit plate is bonded, Cu circuit plate on the silicon nitride substrate etc. is etched selectively, and the circuit pattern may be formed. Ni—P plating layer may be formed on Cu circuit plate after the circuit patterning, and the silicon nitride wiring board may be fabricated.

EXAMPLES

Hereafter, the example of this invention is described. However, this invention is not limited by these examples. Raw material powder of α type silicon nitride with average particle diameter of 0.7-1.2 micrometers, and oxygen amount of 0.5-2.0 mass % was prepared. Amounts shown in FIG. 2 of β type silicon nitride powder are mixed with the above mentioned raw material powder. In used β type silicon nitride powder, amount of oxygen was set to 0.5 mass % or less, mean particle diameter was set to 0.2-10 micrometers, and mean aspect ratio of particles was set to 10 or less. Degrees of in-plane orientation fa in the silicon nitride substrate obtained by above-mentioned condition were equivalent. Furthermore, by mixing MgO and $Lu_2O_3$, or $Gd_2O_3$, $Y_2O_3$ with the above mentioned powder by amounts of oxides shown in FIG. 2, starting materials were fabricated. After mixing 2 mass % of dispersing agent (trade name: Leoguard GP) with this starting material, each of the materials was put in the ball-mill container filled with ethanol, and was mixed. Vacuum drying of the obtained mixture was carried out, and, was granulated through the sieve with apertures of 150 micrometers.

Next, the above-mentioned mixed powder, grinding medium made of silicon nitride, and toluene butanol solution were fed into the pot made of resin in the ball mill. Here, 2 mass % of dispersing agent composed of amines is mixed with the toluene butanol solution. Then, wet blending was carried out for 48 hours. Next, 15 mass % of organic binder made of poly vinyl-polymers, and 5 mass % of plasticizer (dimethyl phthalate) were mixed with 100 mass % of mixed powder in the above-mentioned pot. Subsequently, wet blending was carried out for 48 hours, and the slurry for sheet forming was obtained. After preparing this slurry, green sheet 6 was molded and formed by the doctor blade method. This green sheet is mainly composed of spherical alpha type silicon nitride particle 62, pillar-shaped β type silicon nitride particle 61, the binder, and the dispersing agent, in that sectional view as shown in FIG. 3. Subsequently, molded green sheet 6 is heated at 400-600° C. in the air for 2-5 hours. Thereby, the organic binder component mixed beforehand was fully removed, or degreased. Subsequently, this forming body was sintered in nitrogen atmosphere with pressure of 0.9 MPa (9 atmospheres), at sintering temperature of 1700-2000° C., for 5-50 hours. Then, it was cooled to room temperature. In the sintering process, the body was kept at holding temperature of 1400-1900° C. for 1-10 hours. And the heating rate from this holding temperature to the above-mentioned sintering temperature was set to 1.0-5.0° C./min. After machining the obtained silicon nitride ceramics sheet, the silicon nitride substrate for semiconductor modules with square shape of 50 mm×50 mm and 0.6 mm in thickness was manufactured. The manufacturing conditions of each samples are shown in the column of the examples 1-10 in FIG. 2. As for the thickness of the silicon nitride substrate may be 0.2-2.0 mm preferably.

Figure 4:
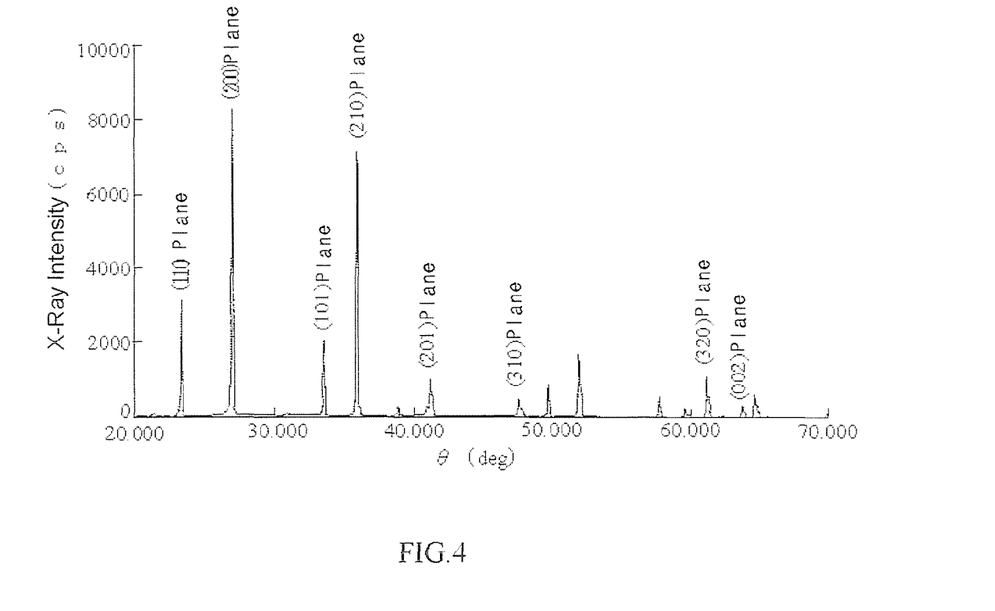
FIG. 4 shows the intensity of refracted X-ray by the silicon nitride substrate concerning embodiments of the invention.

The contents of Lu, Gd, Y, and Mg in the obtained silicon nitride substrate were measured by ICP analysis. These contents were converted to contents as $Lu_2O_3$, $Gd_2O_3$, $Y_2O_3$, and MgO, respectively. In order to investigate degree of in-plane orientation fa of the obtained silicon nitride substrate, the X-ray diffraction by the samples using Cu—K α ray was performed. The intensities of each obtained diffraction peak were measured (by RINT-2500, Rigaku Denki, Japan). This result of the measurement is shown in FIG. 4. On the obtained silicon nitride substrate, as shown below, (1) fracture toughness ($K_{1c}$) and (2) thermal conductivity were measured.

(1) Fracture Toughness ($K_{1c}$)

Figure 5:
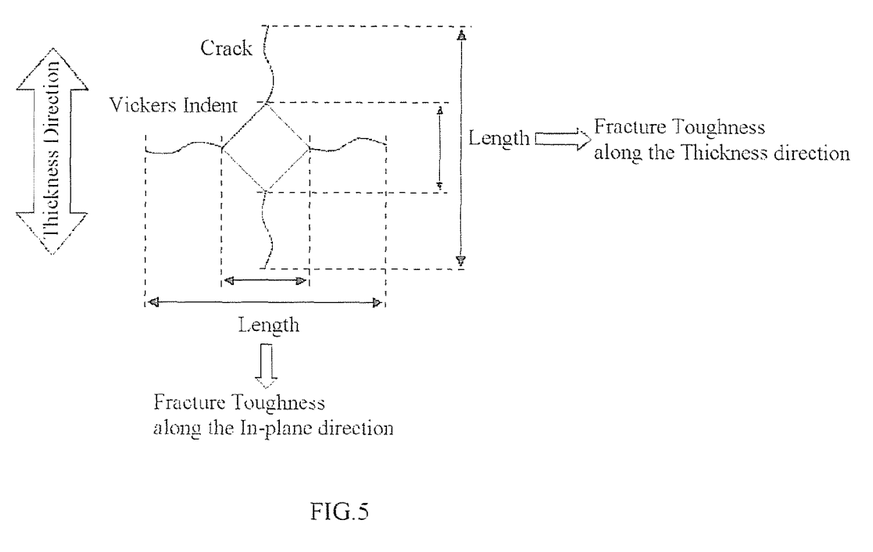
FIG. 5 shows a schematic diagram for explaining the evaluation method of fracture toughness.

Fracture toughness ($K_{1c}$) was measured based on JISR1607 by IF (Indentation Fracture) method, in which Vickers indenter was pressed to the side of the silicon nitride substrate by predetermined pressure (for example, 2 kgf). Here, Vickers indentor was pushed, so that one diagonal line of the Vickers indent might become perpendicular to the thickness direction of the substrate. And as shown in FIG. 5, the fracture toughness along the thickness direction of the silicon nitride substrate was estimated from the length of diagonal line along the thickness direction of the Vickers indent, and the length of the crack extended from the top end, and bottom end of the indent. The fracture toughness along the in-plane direction of the silicon nitride substrate was estimated from the length of the diagonal line along the surface of the Vickers indent, and the length of the crack extended from the left end, and right end of the indent.

(2) Thermal Conductivity

Thermal conductivity was measured based on JISR1611, on samples cut by 5 mm square from the silicon nitride substrates.

Next, the silicon nitride wiring board and the semiconductor module were manufactured using the obtained silicon nitride substrates. Examples of the manufacturing method of the silicon nitride wiring board are as follows. First, active brazing filler was formed on both faces of the silicon nitride substrate by printing, and copper plates were bonded on both faces at temperature of 750° C. After cooling, the copper plates were etched so that the metallic circuit plates and the metal heat sink might be made patterned as predetermined. Instead, patterned copper plate, in which some parts patterned as the circuit are connected in some connection parts and united, may be formed by pressing method and may be used. This patterned copper plate may be bonded on the silicon nitride substrate, on which active brazing filler is formed by printing, similarly. Finally, the connection part which connects the circuit patterns may be cut and removed, and silicon nitride wiring board may be given. Semiconductor devices may be bonded with solder on the metallic circuit plate of the obtained silicon nitride wiring board. Then, wire bonding was carried and the semiconductor module was obtained. On these semiconductor modules, as shown below, (3) heat cycle tests were done, and (4) thermal resistance was measured.

(3) Heat Cycle Test (Reliability Evaluation)

Heat cycle composed of, cooling at −55° C. for 20 minutes, holding at room temperature for 10 minutes, and heating at 150° C. for 20 minutes, was repeated 3000 cycles. Then, it was evaluated whether the crack of the silicon nitride substrate or exfoliation of the metallic circuit plate occurred. The crack was investigated using fluorescent penetrant inspection method.

(4) Thermal Resistance

Figure 6:
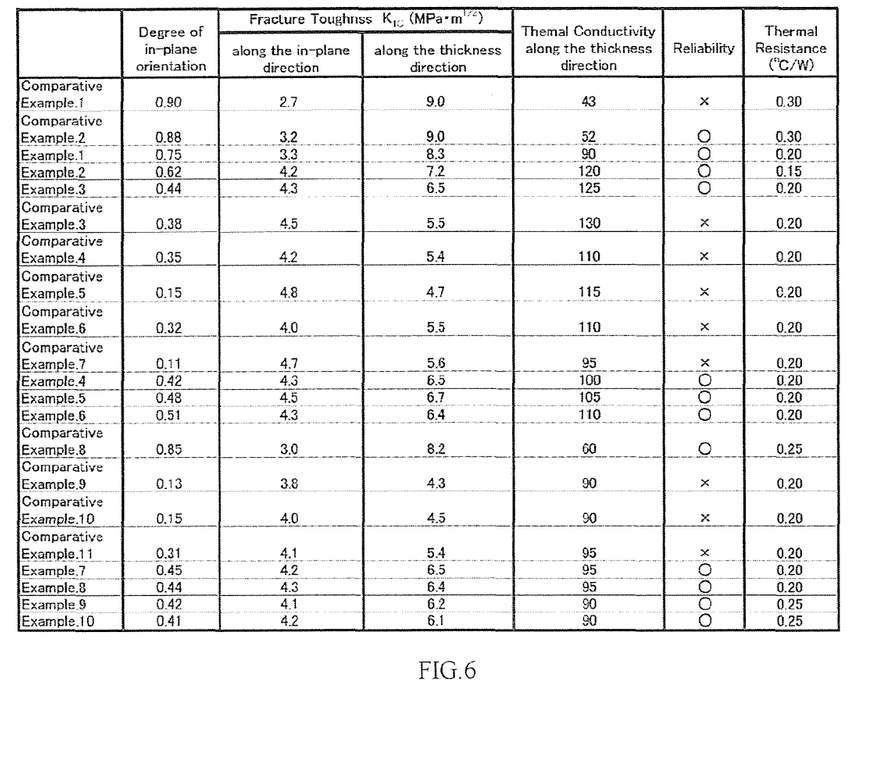
FIG. 6 shows a table showing evaluation results of examples and comparative examples.

This semiconductor module was mounted on water-cooled copper block cooled at 20° C., through a layer made of grease with high thermal conductivity. Current of 14A was given to this semiconductor module, and the voltage after 1 second was measured. Temperature rise was calculated by the relation that was previously measured, between the temperature and the voltage, and thermal resistance was estimated. The measured results corresponding to the manufacturing conditions of the examples 1-10 shown in FIG. 2 are shown in FIG. 6.

Comparative Examples

Figure 2:
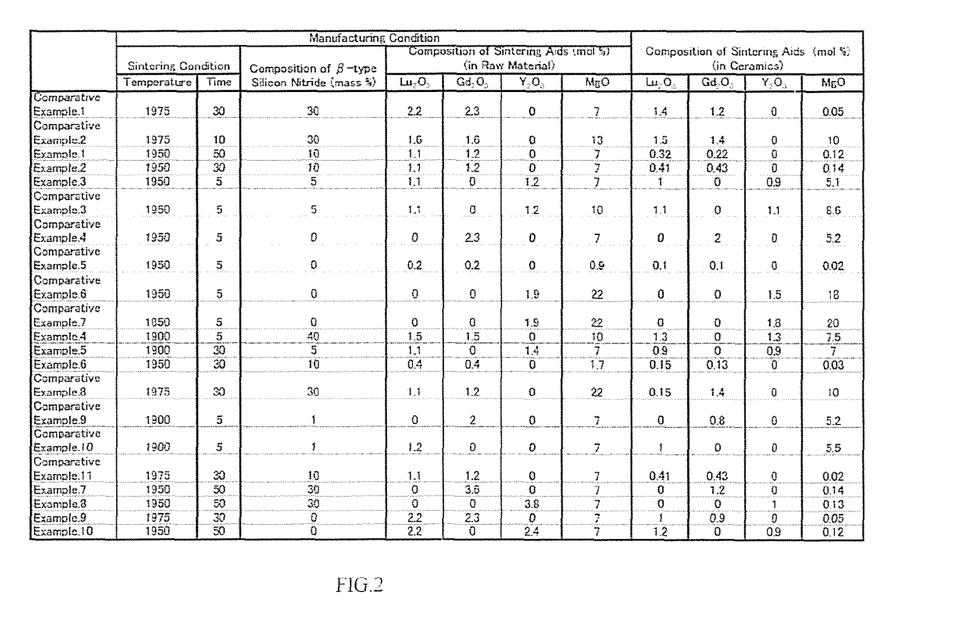
FIG. 2 shows a table showing an example of the composition in the manufacturing conditions for the silicon nitride substrate of examples and comparative examples.
Figure 3:
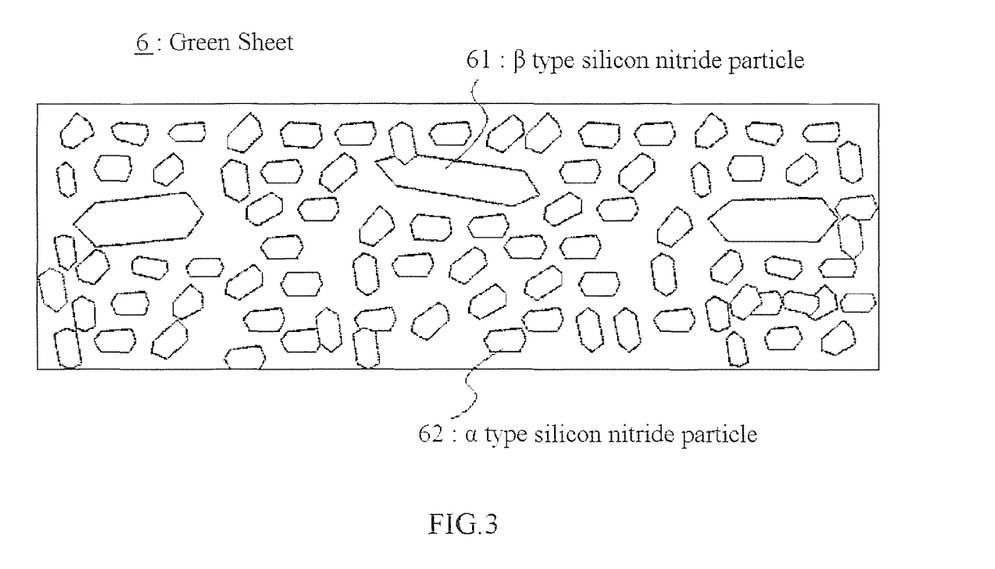
FIG. 3 shows an outline sectional view showing the appearance composition of a green sheet.

Each comparative example was manufactured from raw materials containing sintering aids shown in FIG. 2, and was manufactured using other manufacturing conditions same as examples 1-10. Characteristics were measured by evaluation method as examples 1-10. Results of the sample manufactured by the above manufacturing conditions are shown as comparative examples. 1-11 of FIG. 6.

In example 1 in FIG. 2, starting compositions of sintering aids were set so that $Lu_2O_3$, 1.1 mol %; $Gd_2O_3$, 1.2 mol %; and MgO, 7 mol %; and composition of β type silicon nitride powder was set to 10 mass %. Sintering was done at 1950° C. for 50 hours. As the results, as shown in FIG. 6, degree of in-plane orientation fa of 0.75, fracture toughness along the in-plane direction $K_{1C}$ of 3.3 MPa·m$^{1/2}$, fracture toughness along the thickness direction $K_{1C}$ of 8.3 MPa·m$^{1/2}$, thermal conductivity of 90 W/m·K along the thickness direction, reliability as success (o), and thermal resistance of 0.20° C./W were obtained, respectively. Here, fracture toughness along the in-plane direction $K_{1C}$ is higher than 3.0 MPa·m$^{1/2}$, and fracture toughness $K_{1C}$ along the thickness direction is higher than 6.0 MPa·m$^{1/2}$. Therefore, progress of the crack generated by the thermal stress in the silicon nitride substrate during the manufacture of the silicon nitride wiring board or heat cycle test. Therefore, semiconductor module with high reliability can be obtained. Since the silicon nitride substrate with high thermal conductivity along the thickness direction of 90 W/m·K or higher, was used, the thermal resistance of the semiconductor module becomes as low as 0.2° C./W or lower. These values are enough for radiation substrates for power semiconductors.

In example 2, starting compositions of sintering aids were set so that $Lu_2O_3$, 1.1 mol %; $Gd_2O_3$, 1.2 mol %; and MgO, 7 mol %; and composition of β type silicon nitride powder was set to 10 mass %. Sintering was done at 1950° C. for 30 hours. As the results, as shown in FIG. 6, degree of in-plane orientation fa of 0.62, fracture toughness along the in-plane direction $K_{1C}$ of 4.2 MPa·m$^{1/2}$, fracture toughness along the thickness direction $K_{1C}$ of 7.2 MPa·m$^{1/2}$, thermal conductivity of 120 W/m·K along the thickness direction, reliability as success (o), and thermal resistance of 0.15° C./W were obtained, respectively.

In example 3, starting compositions of sintering aids were set so that $Lu_2O_3$, 1.1 mol %; $Y_2O_3$, 1.2 mol %; and MgO, 7 mol %; and composition of β type silicon nitride powder was set to 5 mass %. Sintering was done at 1950° C. for 5 hours. As the results, as shown in FIG. 6, degree of in-plane orientation fa of 0.44, fracture toughness along the in-plane direction $K_{1C}$ of 4.3 MPa·m$^{1/2}$, fracture toughness along the thickness direction $K_{1C}$ of 6.5 MPa·m$^{1/2}$, thermal conductivity of 125 W/m·K along the thickness direction, reliability as success (o), and thermal resistance of 0.20° C./W were obtained, respectively. In example. 4, starting compositions of sintering aids were set so that $Lu_2O_3$, 1.5 mol %; $Gd_2O_3$, 1.5 mol %; and MgO, 10 mol %; and composition of β type silicon nitride powder was set to 40 mass %. Sintering was done at 1900° C. for 5 hours. As the results, as shown in FIG. 6, degree of in-plane orientation fa of 0.42, fracture toughness along the in-plane direction $K_{1C}$ of 4.3 MPa·m$^{1/2}$, fracture toughness along the thickness direction $K_{1C}$ of 6.5 MPa·m$^{1/2}$, thermal conductivity of 100 W/m·K along the thickness direction, reliability as success (o), and thermal resistance of 0.20° C./W were obtained, respectively.

In example. 5, starting compositions of sintering aids were set so that $Lu_2O_3$, 1.1 mol %; $Y_2O_3$, 1.4 mol %; and MgO, 7 mol %; and composition of β type silicon nitride powder was set to 5 mass %. Sintering was done at 1900° C. or 30 hours. As the results, as shown in FIG. 6, degree of in-plane orientation fa of 0.48, fracture toughness along the in-plane direction $K_{1C}$ of 4.5 MPa·m$^{1/2}$, fracture toughness along the thickness direction $K_{1C}$ of 6.7 MPa·m$^{1/2}$, thermal conductivity of 105 W/m·K along the thickness direction, reliability as success (o), and thermal resistance of 0.20° C./W were obtained, respectively. In example. 6, starting compositions of sintering aids were set so that $Lu_2O_3$, 0.4 mol %; $Gd_2O_3$, 0.4 mol %; and MgO, 1.7 mol %; and composition of β type silicon nitride powder was set to 10 mass %. Sintering was done at 1950° C. for 30 hours. As the results, as shown in FIG. 6, degree of in-plane orientation fa of 0.51, fracture toughness along the in-plane direction $K_{1C}$ of 4.3 MPa·m$^{1/2}$, fracture toughness along the thickness direction $K_{1C}$ of 6.4 MPa·m$^{1/2}$, thermal conductivity of 110 W/m·K along the thickness direction, reliability as success (o), and thermal resistance of 0.20° C./W were obtained, respectively.

In example. 7, starting compositions of sintering aids were set so that $Gd_2O_3$, 3.6 mol %; and MgO, 7 mol %; and composition of β type silicon nitride powder was set to 30 mass %. Sintering was done at 1950° C. for 50 hours. As the results, as shown in FIG. 6, degree of in-plane orientation fa of 0.45, fracture toughness along the in-plane direction $K_{1C}$ of 4.2 MPa·m$^{1/2}$, fracture toughness along the thickness direction $K_{1C}$ of 6.5 MPa·m$^{1/2}$, thermal conductivity of 95 W/m·K along the thickness direction, reliability as success (o), and thermal resistance of 0.20° C./W were obtained, respectively. In example 8, starting compositions of sintering aids were set so that $Y_2O_3$, 3.8 mol %; and MgO, 7 mol %; and composition of β type silicon nitride powder was set to 30 mass %. Sintering was done at 1950° C. for 50 hours. As the results, as shown in FIG. 6, degree of in-plane orientation fa of 0.44, fracture toughness along the in-plane direction $K_{1C}$ of 4.3 MPa·m$^{1/2}$, fracture toughness along the thickness direction $K_{1C}$ of 6.4 MPa·m$^{1/2}$, thermal conductivity of 95 W/m·K along the thickness direction, reliability as success (o), and thermal resistance of 0.20° C./W were obtained, respectively.

In example 9, starting compositions of sintering aids were set so that $Lu_2O_3$, 2.2 mol %; $Gd_2O_3$, 2.3 mol %; and MgO, 7 mol %; and composition of β type silicon nitride powder was set to 0 mass %. Sintering was done at 1975° C. for 30 hours. As the results, as shown in FIG. 6, degree of in-plane orientation fa of 0.42, fracture toughness along the in-plane direction $K_{1C}$ of 4.1 MPa·m$^{1/2}$, fracture toughness along the thickness direction $K_{1C}$ of 6.2 MPa·m$^{1/2}$, thermal conductivity of 90 W/m·K along the thickness direction, reliability as success (o), and thermal resistance of 0.25° C./W were obtained, respectively. In example 10, starting compositions of sintering aids were set so that $Lu_2O_3$, 2.2 mol %; $Y_2O_3$, 2.4 mol %; and MgO, 7 mol %; and composition of β type silicon nitride powder was set to 0 mass %. Sintering was done at 1950° C. for 50 hours. As the results, as shown in FIG. 6, degree of in-plane orientation fa of 0.41, fracture toughness along the in-plane direction $K_{1C}$ of 4.2 MPa·m$^{1/2}$, fracture toughness along the thickness direction $K_{1C}$ of 6.1 MPa·m$^{1/2}$, thermal conductivity of 90 W/m·K along the thickness direction, reliability as success (o), and thermal resistance of 0.25° C./W were obtained, respectively.

On the other hand, in comparative example. 1, starting compositions of sintering aids were set so that $Lu_2O_3$, 2.2 mol %; $Gd_2O_3$, 2.3 mol %; and MgO, 7 mol %; and composition of β type silicon nitride powder was set to 30 mass %. Sintering was done at 1975° C. for 30 hours. As the results, as shown in FIG. 6, degree of in-plane orientation fa of 0.90, fracture toughness along the in-plane direction $K_{1C}$ of 2.7 MPa·m$^{1/2}$, fracture toughness along the thickness direction $K_{1C}$ of 9.0 MPa·m$^{1/2}$, thermal conductivity of 43 W/m·K along the thickness direction, reliability as failure (x), and thermal resistance of 0.30° C./W were obtained, respectively. Comparatively large amount of β type silicon nitride powder was added, and sintering was done at comparatively high temperature of 1975° C., and for comparatively long time of 30 hours. Here, pillar-shaped particles are selectively grown in in-plane direction, because added β type silicon nitride powder particle may be act as nuclei of the growth. Therefore, degree of in-plane orientation fa became high. Therefore, although fracture toughness along the thickness direction was made high, fracture toughness along the in-plane direction became extremely low, and crack was generated in the silicon nitride substrate after the heat cycle test. Since degree of in-plane orientation fa was high, the thermal conductivity along the thickness direction also became low. The thermal resistance of semiconductor module using this substrate also became high.

In comparative example 2, starting compositions of sintering aids were set so that $Lu_2O_3$, 1.6 mol %; $Gd_2O_3$, 1.6 mol %; and MgO, 13 mol %; and composition of β type silicon nitride powder was set to 30 mass %. Sintering was done at 1975° C. for 30 hours. As the results, as shown in FIG. 6, degree of in-plane orientation fa of 0.88, fracture toughness along the in-plane direction $K_{1C}$ of 3.2 MPa·m$^{1/2}$, fracture toughness along the thickness direction $K_{1C}$ of 9.0 MPa·m$^{1/2}$, thermal conductivity of 52 W/m·K along the thickness direction, reliability as success (o), and thermal resistance of 0.30° C./W were obtained, respectively. Comparatively large amount of β type silicon nitride powder was added, and sintering was done at high temperature. Therefore, degree of in-plane orientation fa became high, and thermal conductivity along the thickness direction became low. Therefore, the thermal resistance of semiconductor module using this substrate also became high.

In comparative example 3, starting compositions of sintering aids were set so that $Y_2O_3$, 1.2 mol %; $Gd_2O_3$, 1.6 mol %; and MgO, 10 mol %; and composition of β type silicon nitride powder was set to 5 mass %. Sintering was done at 1900° C. for 5 hours. As the results, as shown in FIG. 6, degree of in-plane orientation fa of 0.38, fracture toughness along the in-plane direction $K_{1C}$ of 4.5 MPa·m$^{1/2}$, fracture toughness along the thickness direction $K_{1C}$ of 5.5 MPa·m$^{1/2}$, thermal conductivity of 130 W/m·K along the thickness direction, reliability as failure (x), and thermal resistance of 0.20° C./W were obtained, respectively. Comparatively small amount of β type silicon nitride powder was added, and sintering was done at comparatively low temperature and for comparatively short time. Therefore, degree of in-plane orientation fa became low, and the fracture toughness along the thickness direction became low, and crack was generated in the silicon nitride substrate after the heat cycle test.

In comparative example 4, starting compositions of sintering aids were set so that $Gd_2O_3$, 2.3 mol % and MgO, 7 mol % and composition of β type silicon nitride powder was set to 0 mass %. Sintering was done at 1950° C. for 5 hours. As the results, as shown in FIG. 6, degree of in-plane orientation fa of 0.35, fracture toughness along the in-plane direction $K_{1C}$ of 4.2 MPa·m$^{1/2}$, fracture toughness along the thickness direction $K_{1C}$ of 5.4 MPa·m$^{1/2}$, thermal conductivity of 110 W/m·K along the thickness direction, reliability as failure (x), and thermal resistance of 0.20° C./W were obtained, respectively. Without adding β type silicon nitride powder, and without adding $Lu_2O_3$, there were few generated amounts of the liquid phase at high temperature, and grain growth was inhibited. Therefore, degree of in-plane orientation fa became low, and the fracture toughness along the thickness direction became low, and crack was generated in the silicon nitride substrate after the heat cycle test.

In comparative example 5, starting compositions of sintering aids were set so that $Lu_2O_3$, 0.2 mol %; $Gd_2O_3$, 0.2 mol %; and MgO, 0.9 mol %; and composition of β type silicon nitride powder was set to 5 mass %. Sintering was done at 1950° C. for 5 hours. As the results, as shown in FIG. 6, degree of in-plane orientation fa of 0.15, fracture toughness along the in-plane direction $K_{1C}$ of 4.8 MPa·m$^{1/2}$, fracture toughness along the thickness direction $K_{1C}$ of 4.7 MPa·m$^{1/2}$, thermal conductivity of 115 W/m·K along the thickness direction, reliability as failure (x), and thermal resistance of 0.20° C./W were obtained, respectively. Without adding β type silicon nitride powder, and because sintering time was comparatively short, grain growth was inhibited. Therefore, degree of in-plane orientation fa became low, and the fracture toughness along the thickness direction became low, and crack was generated in the silicon nitride substrate after the heat cycle test.

In comparative example 6, starting compositions of sintering aids were set so that $Y_2O_3$, 1.9 mol % and MgO, 22 mol % and composition of β type silicon nitride powder was set to 0 mass %. Sintering was done at 1950° C. for 5 hours. As the results, as shown in FIG. 6, degree of in-plane orientation fa of 0.32, fracture toughness along the in-plane direction $K_{1C}$ of 4.0 MPa·m$^{1/2}$, fracture toughness along the thickness direction $K_{1C}$ of 5.5 MPa·m$^{1/2}$, thermal conductivity of 110 W/m·K along the thickness direction, reliability as failure (x), and thermal resistance of 0.20° C./W were obtained, respectively. For the same reason as comparative example 4, degree of in-plane orientation fa became low, the fracture toughness along the thickness direction became low, and crack was generated in the silicon nitride substrate after the heat cycle test.

In comparative example 7, starting compositions of sintering aids were set so that $Y_2O_3$, 1.9 mol % and MgO, 22 mol % and composition of β type silicon nitride powder was set to 0 mass %. Sintering was done at 1850° C. for 5 hours. As the results, as shown in FIG. 6, degree of in-plane orientation fa of 0.11, fracture toughness along the in-plane direction $K_{1C}$ of 4.7 MPa·m$^{1/2}$, fracture toughness along the thickness direction $K_{1C}$ of 5.6 MPa·m$^{1/2}$, thermal conductivity of 95 W/m·K along the thickness direction, reliability as failure (x), and thermal resistance of 0.20° C./W were obtained, respectively. Because β type silicon nitride powder and $Lu_2O_3$ were not added, and the sintering was done at comparatively low temperature and for comparatively short time, there were few generated amounts of the liquid phase during the sintering, and grain growth was inhibited. Therefore, degree of in-plane orientation fa became low, and the fracture toughness along the thickness direction became low, and crack was generated in the silicon nitride substrate after the heat cycle test.

In comparative example 8, starting compositions of sintering aids were set so that $Lu_2O_3$, 1.1 mol % and $Gd_2O_3$, 1.2 mol % and MgO, 22 mol %; and composition of β type silicon nitride powder was set to 30 mass %. Sintering was done at 1975° C. for 30 hours. As the results, as shown in FIG. 6, degree of in-plane orientation fa of 0.85, fracture toughness along the in-plane direction $K_{1C}$ of 3.0 MPa·m$^{1/2}$, fracture toughness along the thickness direction $K_{1C}$ of 8.2 MPa·m$^{1/2}$, thermal conductivity of 60 W/m·K along the thickness direction, reliability as success (o), and thermal resistance of 0.25° C./W were obtained, respectively. For the same reason as comparative example 1, degree of in-plane orientation fa became high, thermal conductivity along the thickness direction became low, and the thermal resistance of semiconductor module using this substrate became high.

In comparative example 9, starting compositions of sintering aids were set so that $Gd_2O_3$, 2 mol % and MgO, 7 mol % and composition of β type silicon nitride powder was set to 1 mass %. Sintering was done at 1900° C. for 5 hours. As the results, as shown in FIG. 6, degree of in-plane orientation fa of 0.13, fracture toughness along the in-plane direction $K_{1C}$ of 3.8 MPa·m$^{1/2}$, fracture toughness along the thickness direction $K_{1C}$ of 4.3 MPa·m$^{1/2}$, thermal conductivity of 90 W/m·K along the thickness direction, reliability as failure (x), and thermal resistance of 0.20° C./W were obtained, respectively. Here, $Lu_2O_3$ was not added, added amount of β type silicon nitride powder was comparatively small, and the sintering was done at comparatively low temperature and for comparatively short time. Therefore, there were few generated amounts of the liquid phase during the sintering, and since grain growth was inhibited, degree of in-plane orientation fa became low, and the fracture toughness along the thickness direction became low and crack was generated in the silicon nitride substrate after the heat cycle test.

In comparative example 10, starting compositions of sintering aids were set so that $Lu_2O_3$, 1.2 mol % and MgO, 7 mol %, and composition of β type silicon nitride powder was set to 1 mass %. Sintering was done at 1900° C. or 5 hours. As the results, as shown in FIG. 6, degree of in-plane orientation fa of 0.15, fracture toughness along the in-plane direction $K_{1C}$ of 4.0 MPa·m$^{1/2}$, fracture toughness along the thickness direction $K_{1C}$ of 4.5 MPa·m$^{1/2}$, thermal conductivity of 90 W/m·K along the thickness direction, reliability as failure (x), and thermal resistance of 0.20° C./W were obtained, respectively. Because added amount of β type silicon nitride powder was comparatively small, and the sintering was done at comparatively low temperature and for comparatively short time, there were few generated amounts of the liquid phase during the sintering, and grain growth was inhibited. Therefore, degree of in-plane orientation fa became low, and the fracture toughness along the thickness direction became low, and crack was generated in the silicon nitride substrate after the heat cycle test.

In comparative example 11, starting compositions of sintering aids were set so that $Lu_2O_3$, 1.1 mol %; $Gd_2O_3$, 1.2 mol %; and MgO, 7 mol %; and composition of β type silicon nitride powder was set to 10 mass %. Sintering was done at 1975° C. for 30 hours. As the results, as shown in FIG. 6, degree of in-plane orientation fa of 0.31, fracture toughness along the in-plane direction $K_{1C}$ of 4.1 MPa·m$^{1/2}$, fracture toughness along the thickness direction $K_{1C}$ of 5.4 MPa·m$^{1/2}$, thermal conductivity of 95 W/m·K along the thickness direction, reliability as failure (x), and thermal resistance of 0.20° C./W were obtained, respectively. Because added amount of MgO was comparatively small, and the sintering was done at comparatively high temperature and for comparatively long time, evaporated amount of MgO is large, and there were few generated amounts of the liquid phase during the sintering, and grain growth was inhibited. Therefore, degree of in-plane orientation fa became low, and the fracture toughness along the thickness direction became low, and crack was generated in the silicon nitride substrate after the heat cycle test.

As mentioned above, in examples 1-3, 5-10 mass % of β type silicon nitride powder, and 1.1 mol % of $Lu_2O_3$ were added. By being sintered at 1950° C., a lot of liquid phase during the sintering was generated, and in-plane growth of pillar-shaped particles was moderately accelerated because added β type silicon nitride powder particles might act as nuclei of the growth. Therefore, degree of in-plane orientation fa was set to 0.4-0.8. Moreover, even if the sintering temperature is as low as 1900° C. in example 4, by adding enough amount such as 40 mol % of β type silicon nitride powder and 1.5 mol % of $Lu_2O_3$, degree of in-plane orientation fa became 0.4 or higher. And like examples 6-8, even when added amount of $Lu_2O_3$ was few such as 0-0.4 mol %, by setting the sintering at high temperature, such as 1950° C., and for a long time, such as 30-50 hours, degree of in-plane orientation fa became 0.4 or higher. And like examples 5, 9, and 10 even when added amount of β type silicon nitride powder was few such as 0-5 mass %, by adding 1.1 mol % or more of $Lu_2O_3$, and setting the sintering for a long time such as 30 hours or longer, degree of in-plane orientation fa became 0.4 or higher.

On examples with degree of in-plane orientation of 0.4-0.8, fracture toughness along the thickness direction $K_{1C}$ is higher than that along the in-plane direction. In these examples, the fracture toughness along the thickness direction $K_{1C}$ of 6.0 MPa·m$^{1/2}$ or higher, the fracture toughness along the in-plane direction $K_{1C}$ of 3.0 MPa·m$^{1/2}$ or higher, and the thermal conductivity along the thickness direction of 90 W/m·K or higher, were obtained.

As mentioned above, these embodiments have been explained in full detail with reference to drawings. However, concrete composition is not restricted to these embodiments, and even if there is change of design of the range which does not deviate from the gist of this invention etc., it is also included in this invention.

What is claimed is:

1. A silicon nitride substrate containing β type silicon nitride particles, magnesium (Mg) doped with 0.03~7.0 mol % of MgO, lutetium (Lu) doped with 0.15~1.00 mol % of $Lu_2O_3$, one element selected from Rare Earth (RE) elements excluding Lu and including Y doped with 0.13~0.90 mol % of oxide of said one-element, wherein degree of in-plane orientation fa, which is a ratio of orientation along in-plane direction perpendicular to thickness direction of said silicon nitride substrate, is 0.4~0.8, wherein fracture toughness along thickness direction of said silicon nitride substrate expressed as A, is A≧6.0 Mpa·m$^{1/2}$, and fracture toughness along in-plane direction of said silicon nitride substrate expressed as B, is B≧3.0 Mpa·m$^{1/2}$, and 1.488≦A/B≦1.7143, wherein thermal conductivity along said thickness direction is higher than 105 W/m·K, wherein said degree of in-plane orientation fa is expressed as formula (1), $$fa=(P-P_0)/(1-P_0) \qquad (1)$$

wherein P is expressed as formula (2), and P means a ratio of sum of diffracted X-ray intensities by (110), (200), (210), (310), and (320) planes of β type silicon nitride in said silicon nitride substrate, and wherein $P_0$ is expressed as formula (3), and $P_0$ means a ratio of sum of diffracted X-ray intensities by (110), (200), (210), (310), and (320) planes of β type silicon nitride in said silicon nitride particles, $$P=(I_{(110)}+I_{(200)}+I_{(210)}+I_{(310)}+I_{(320)})/(I_{(110)}+I_{(200)}+I_{(101)}+I_{(210)}+I_{(201)}+I_{(310)}+I_{(320)}+I_{(002)}) \qquad (2)$$

$$P_O=(I'_{(110)}+I'_{(200)}+I'_{(210)}+I'_{(310)}+I'_{(320)})/(I'_{(110)}+I'_{(200)}+I'_{(101)}+I'_{(210)}+I'_{(201)}+I'_{(310)}+I'_{(320)}+I'_{(002)}) \qquad (3).$$

2. A silicon nitride wiring board comprising:
the silicon nitride substrate according to claim 1;
a metal circuit plate bonded on one face of said silicon nitride substrate; and
a metal heat sink bonded on another face of said silicon nitride substrate.

3. A semiconductor module comprising:
the silicon nitride wiring board according to claim 2; and
a semiconductor device mounted on said silicon nitride wiring board.

4. A manufacturing method of a silicon nitride substrate, comprising the steps of:
mixing α type silicon nitride powder with oxygen concentration of 2.0 mass % or less, 5~10 mass % of β type silicon nitride powder with β fraction of 30~100% and with oxygen concentration of 0.5 mass % or less and with mean particle diameter of 0.2~10 μm and with mean aspect ratio of 10 or less, 0.4~1.1 mol % of $Lu_2O_3$ powder, 1.7~7.0 mol % of MgO, and 0.4~1.4 mol % of oxide of doped elements comprising at least one element selected from rare earth elements excluding Lu and including Y;
making a forming body from the mixed powder; and
sintering said forming body at temperature of 1900~1950° C. in pressurized nitrogen atmosphere at pressure of 0.5~1.0 MPa for 5~30 hours.

* * * * *